United States Patent [19]
Martin et al.

[11] Patent Number: 5,532,173
[45] Date of Patent: Jul. 2, 1996

[54] FET OPTICAL RECEIVER USING BACKSIDE ILLUMINATION, INDIUM MATERIALS SPECIES

[75] Inventors: Eric A. Martin, Medford; Kenneth Vaccaro, Acton, both of Mass.; William Waters, Glassboro, N.J.; Joseph P. Lorenzo, Stow, Mass.; Stephen Spaziani, Nashua, N.H.

[73] Assignee: The United States of America as represented by the Secretary of the Air Force, Washington, D.C.

[21] Appl. No.: 274,930

[22] Filed: Jul. 14, 1994

[51] Int. Cl.$^6$ .................................................. H01L 31/18
[52] U.S. Cl. ...................... 437/2; 437/3; 437/6; 437/209; 437/912; 148/DIG. 135
[58] Field of Search .................... 437/2, 3, 6, 209; 148/DIG. 135; 257/445, 460, 461, 462, 466

[56] References Cited

U.S. PATENT DOCUMENTS

| | | | |
|---|---|---|---|
| 4,532,536 | 7/1985 | Hatanaka et al. | 257/449 |
| 4,625,226 | 11/1986 | Antell | 257/461 |
| 4,678,542 | 7/1987 | Boer et al. | 257/449 |
| 4,990,489 | 2/1991 | Elhamamsy et al. | 257/460 |
| 5,008,213 | 4/1991 | Kolesar, Jr. | 437/51 |
| 5,130,259 | 7/1992 | Bahraman | 437/2 |
| 5,138,145 | 8/1992 | Nakamura et al. | 437/3 |
| 5,141,878 | 8/1992 | Benton et al. | 437/3 |
| 5,180,681 | 1/1993 | Mishra et al. | 437/40 |
| 5,204,278 | 4/1993 | Imamura et al. | 437/40 |
| 5,252,852 | 10/1993 | Makiuchi et al. | 257/461 |

OTHER PUBLICATIONS

USAF Invention Disclosure: Packaging Process for Long Wavelength Backside Illuminated Photo-Transistor Receiver, pp. 2–3. No Date.
E. A. Martin, K. Vaccaro, W. Waters, S. Spaziani, and J. P. Lorenzo, Processing and Design Techniques for InGaAs/InAlAs/InP Photo FETs and MSMs, Mar. 1994, pp. 347–350.
"Light–Induced Effects in GaAs F.E.T.S." by J. Graffeuil et al, Electronics Letters vol. 15 No. 14, 5 Jul. 1979.
"Potential of CCDs for UV and X–ray plasma diagnostics" by J. R. Jamesick et al Review of Scientific Instruments 56(5), May 1985.
"Picosecond HEMT Photodetector" by T. Umeda et al Japanese Journal of Applied Science, vol. 25 No. 10, Oct. 1986.
Effect of Signal–Modulated Optical Radiation on the Characteristics of a Modfet by H. Mitra et al Applied Physics A56, 335–341 (1993).

Primary Examiner—Kevin M. Picardat
Attorney, Agent, or Firm—Gerald B. Hollins; Thomas L. Kundert

[57] ABSTRACT

A photo FET device having a large area backside optical energy reception surface is disclosed. The photo FET device is fabricated in the source gate and drain upward configuration using a lattice determining surrogate substrate and a mesa-forming deep etch processing sequence and then inverted onto a new permanent substrate member and the surrogate substrate member removed in order to expose the active area backside optical energy reception surface. Fabrication of the device from two possible indium-inclusive semiconductor materials and a particular gate metal alloy is also disclosed.

11 Claims, 2 Drawing Sheets

FET OPTICAL RECEIVER USING BACKSIDE ILLUMINATION, INDIUM MATERIALS SPECIES

RIGHTS OF THE GOVERNMENT

The invention described herein may be manufactured and used by or for the Government of the U.S. for all governmental purposes without the payment of any royalty.

CROSS REFERENCE TO RELATED APPLICATIONS

The present document is somewhat related to the copending and commonly assigned applications "Backside Illuminated FET Optical Receiver and Method with Gallium Arsenide Species," Ser. No. 08/274,931; Wafer Joined Opto Electronic Integrated Circuits and Methods, Ser. No. 08/274,882; and Backside Illuminated MSM Device, Ser. No. 08/274,889 which are filed of even date herewith in the name of different inventor entities. The contents of these related applications are hereby incorporated by reference herein.

BACKGROUND OF THE INVENTION

This invention relates to the field of optical to electrical signal transducer devices and their fabrication in the form of an indium material inclusive field effect transistor.

High data rate optical communications systems require high speed optical receivers for information transmittal. These receivers must include an integral high speed optical detector to convert the optical signal to an electrical signal. The semiconductor indium gallium arsenide (InGaAs) when grown lattice matched or near lattice matched to indium phosphide (InP) is a desirable material for such receivers due to its internal electron speed and its efficient absorption of radiation in the 1.3–1.6 micrometer wavelengths favorable to optical fiber communications. The presence of metal electrodes on the front surface of these devices, however, reduces their optical collection efficiency through shadowing. Backside illumination of such detectors is therefore preferred. Electrical contact must then be made to the front surface of the semiconductor device, and illumination applied to the back side.

Semiconductor PIN photodiodes are currently the most widely used detector for this high data rate and other forms of optical communications. Inherently, however, these diodes must comprise semiconductor material of both n-type (electron rich) and p-type (hole rich) regions. Although this material requirement is compatible with bipolar transistor technology, it is highly inconsistent with the now predominant Field Effect Transistor (FET) technology. In order to be integratable with such FET circuits, a detector must be fabricated as a unipolar device. Photoconductors are unipolar detectors but suffer from slow response and often have high dark current electrical characteristics—which reduces the available signal-to-noise ratio. Metal Semiconductor Metal (MSM) detectors are back-to-back Shottky diodes typically formed as interdigited metal fingers (gates). These devices are fully compatible with FET processing but have no internal gain.

There is therefore a widely perceived need in the electronic art for a practical optical-to-electrical transducer or photodetector or optical receiver device that can be directly integrated into currently used integrated circuit devices, a photodetector that is fully compatible with the fabrication processes and physical and electrical properties of currently used integrated circuit families. The photo field effect transistor inventions of the present patent document and the above-identified and incorporated by reference herein patent documents are believed to provide desirable answers for this need.

The U.S. patent art indicates the presence of considerable inventive activity, especially with respect to the MESFET (metal semiconductor field effect transistor) device and its use as an electrical circuit element. Prior patent activity appears however not to have extended into the area of photo optical transducing use of the MESFET device as is disclosed herein.

Previous MESFET related patents include the patent of U.K. Mishra et al, U.S. Pat. No. 5,180,681, which is concerned with the fabrication of a high current high voltage breakdown field effect transistor of the MESFET type, including the fabrication of such devices with gallium arsenide material. In addition the invention of S. Inmamura et al, in U.S. Pat. No. 5,204,278, discloses the use of Group III–V periodic table semiconductor compounds such as gallium arsenide in the MESFET device configuration including a Shottky gate electrode arrangement. In addition, the invention of E. Kolesar, Jr., U.S. Pat. No. 4,989,063 is of general background interest with respect to the present invention in the sense that it discloses the use of an epoxy adhesive during a semiconductor device fabrication sequence.

Neither the application of the MESFET configuration to optical transducing devices nor the improved configuration of a MESFET device for this usage is known to have been accomplished in the U.S. patent prior art, however.

Several publications from the technical literature are also of interest as background information with respect to the present invention. These publications include an early discussion of the compound materials inclusive FET device as a photodetector in the article "Light-Induced Effects in GaAs F.E.T.S." by J. Graffeuil et al which appears in the publication "Electronics Letters" Vol. 15 No. 14, 5 Jul. 1979. Although this article is concerned with GaAs FET devices it does not involve the substrate removal and backside illumination concepts of the present invention.

The article "Potential of CCDs for UV and X-ray plasma diagnostics" by J. R. Jamesick et al which appears in the publication "Review of Scientific Instruments 56(5), May 1985 is also of this background interest since it discusses the use of backside illumination techniques in the silicon based integrated circuit art. Since the Jamesick discussion in focused on CCD and silicon technology and not on the signal gain generating, compound materials and substrate removed aspects of the present invention it appears also to be of limited background interest with respect to the present invention.

The article "Picosecond HEMT Photodetector" by T. Umeda et al which appears in the Japanese Journal of Applied Science, Vol 25 No. 10, October 1986, discusses a gallium arsenide based high speed photodetector of the FET type. This discussion also does not extend to the areas of substrate removal and backside illumination. The article "Effect of Signal-Modulated Optical Radiation on the Characteristics of a Modfet by H. Mitra et al which appears in the publication Applied Physics A56, 335–341 (1993) discusses the response of a Gallium Arsenide compound material FET device to a modulated optical signal and provides an analytical model for such response. The Mitra article is however concerned with frontside received illumination.

SUMMARY OF THE INVENTION

The present invention provides a photo FET device, particularly a device of the MESFET type and indium material composition, that overcomes at least one important disadvantage of previous photo devices by providing unobstructed access to the device's charge carrier transport region—i.e., a device providing optical energy access by location of the necessary source gate and drain electrodes and their accompanying metallization on the substrate side of the FET structure. The invention also includes a particular semiconductor material species embodiment of an improved access FET device and its fabrication.

It is an object of the present invention therefore, to provide an optically efficient photo FET device.

It is another object of the invention to provide a photo FET device in which substantially one hundred percent of the device's charge transport region surface area is made available for optical energy impingement.

It is another object of the invention to provide a high-speed photo FET device.

It is another object of the invention to provide a photo FET device that can be fabricated with indium inclusive semiconductor materials.

It is another object of the invention to provide an optical-to-electrical transducer device that provides electrical signal gain properties in addition to optical signal to electrical signal transducing capability.

It is another object of the invention to provide a photo FET device that may be fabricated in a plurality of different physical size and physical arrangement configurations.

It is another object of the invention to provide a practical method of fabricating an indium materials based upside-down photo field effect transistor device.

It is another object of the invention to provide a periodic table Group III–V materials based photo field effect transistor.

It is another object of the invention to provide a photo FET device having a data communications usable optical spectrum response characteristic.

Additional objects and features of the invention will be understood from the following description and claims and the accompanying drawings.

These and other objects of the invention are achieved by the method of fabricating an indium inclusive photo field effect transistor of high optical energy sensitivity comprising the steps of:

growing, on an indium phosphide surrogate temporary first substrate member, an indium phosphide lattice-matched epitaxial layer having a composition taken from the materials group consisting of indium gallium arsenide and indium aluminum arsenide;

etching said epitaxial layer until a plurality of upstanding mesas thereof remain, said etching including removal of said epitaxial layer material from a top surface down to said substrate member at locations intermediate of said mesas;

depositing ohmic metal source and drain contacts on laterally segregated exposed top surface portions of said epitaxial layer mesas;

etching a gate recess into said epitaxial layer top surface at a location intermediate said ohmic metal contacts in each of said mesas;

forming a metallic electrically insulated Shottky gate member in said top surface gate recess of each said mesa;

covering said top surface, said Shottky gate member and said adjacent source and drain ohmic contact metal with an inert material passivation layer;

filling said locations intermediate of said mesas with an inert filling material to form a coplanar surface with said passivated top surface, Shottky gate member and adjacent source and drain ohmic contact metal;

bonding said planar surface to a second permanent substrate member to form a covered topside assembly;

removing said indium phosphide surrogate first substrate member from said covered topside assembly to expose an optical energy receptive and unencumbered backside epitaxial layer surface of said mesas and optical energy receptive and unencumbered backside portions of said Shottky gate member metal, and said source and drain ohmic contact metal;

making external circuit communication connections with said Shottky gate metal, and said source and drain ohmic contact metal; and overlaying said exposed backside epitaxial layer surface with an inert second material passivation layer.

DETAILED DESCRIPTION

Figure 1A:
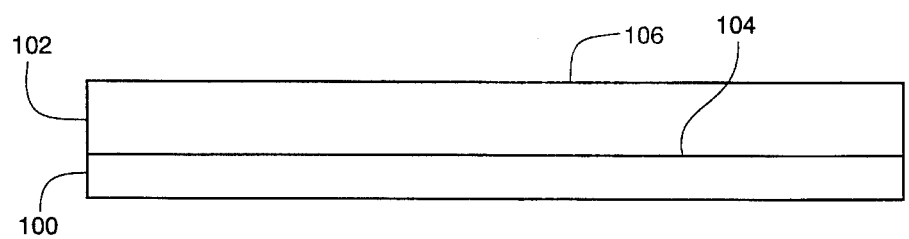
FIG. 1A shows the addition of an epitaxial layer to a semiconductor substrate member in the fabrication of a device according to the present invention.

FIG. 1 in the drawings shows a fabrication sequence for indium inclusive photo field effect transistors (photo FETs) in accordance with the present invention. Although the photo FET devices of the FIG. 1 fabrication sequence bear certain similarities to the devices described in the above referred-to and herein incorporated-by-reference companion application of Gerald Robinson, the following fabrication sequence will clarify certain differences and distinctions in the present invention species of the backside illuminated photo FET of the Robinson patent document.

FIG. 1A in the drawings therefore shows a preliminary portion of the fabrication sequence for a photo FET according to the present invention. In the FIG. 1A drawing an epitaxial layer 102 having an upper surface 106 has been added to a substrate member 100 at its surface 104. According to the present invention, it is desirable that the substrate 100 be made of the periodic table Group III–V materials such as indium phosphide and moreover that the material of the epitaxial layer 102 be grown in a lattice matched or near lattice matched relationship with the indium phosphide of the substrate 100. In practice it is found that the semiconductor materials indium gallium arsenide (InGaAs) and indium aluminum arsenide (InAlAs) can be grown in this lattice matched or near lattice matched condition without great difficulty. These two three-metal combinations are therefore the preferable composition material for the epitaxial layer 102 in FIG. 1A.

Structures of the FIG. 1A type having a lattice matched or near lattice matched epitaxial layer 102 received on an indium phosphide substrate 100 are often fabricated by attaching the epitaxial material to an ethyl or methyl molecule in a loose bonding arrangement that is easily broken or decomposed in a processing furnace to leave the epitaxial layer 102. This process is known in the art and is preferably used in fabrication of the present invention periodic table Group III–V semiconductor materials.

For present invention purposes, the substrate 100 and the epitaxial layer 102 may include doping materials such as silicon and have doping concentrations of $7.5 \times 10^{11}$ atoms per square centimeter. Semiconductor wafers having these properties, i.e., wafers in which the FIG. 1A step has been accomplished by the supplier, are available from commercial suppliers to the integrated circuit device fabrication industry, i.e., from source such as Quantum Epitaxial Design Inc. (QED) of Bethlehem, Pa. Material of this type is also available from Epitaxial Products Inc. (EPI) of Cardiff, Wales, UK or the U.S. subsidiary of EPI located in Londonderry, N.H. Three-inch wafers are available from QED and two-inch wafers from EPI.

Doping levels for the epitaxial InGaAs or InAlAs materials of the layer 102 may be modified to vary the properties of the achieved FET devices, such variation for example, being useful in determining the depletion mode or enhancement mode operating characteristics of the completed transistor device.

Figure 1B:
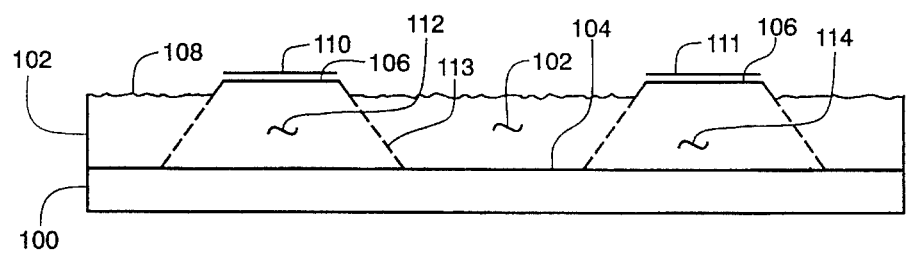
FIG. 1B shows the commencement of an etching away of the FIG. 1A epitaxial layer to form mesas of semiconductor material.

FIG. 1B in the drawings shows a composite second step in the fabrication of a photo FET device according to the present invention. In the FIG. 1B step, there is shown the photoresist mask portions 110 and 111 by which an etching away of substantial portions of the epitaxial layer 102 is to be accomplished. FIG. 1B in fact shows a commencement of this etching away process in its essential absence of the full extent of surface 106 and its replacement of this surface with the lower and partially-etched surface 108. In this FIG. 1B etching arrangement, therefore, the portions of the surface 106 residing below the photoresist mask portions at 110 and 111 remain and the etching process is underway. Etching arrangements as represented in FIG. 1B involve the application of photoresist material, the use of a photographic mask, and development or processing of the exposed photoresist material, all as are known and commonly practiced in the semiconductor art.

The expected additional progression of the etching sequence shown in FIG. 1B to form the two mesas of epitaxial material at 112 and 114 is indicated typically at 113 in FIG. 1B. The sloping sides indicated at 113 for the mesa 112 is of course the result of preferential etching rates, as is commonly known for the different material orientations (110, 111, etc.) in the semiconductor art. It is particularly notable that the etching which is represented to be underway in FIG. 1B is carried to a degree that is perhaps unusual in the semiconductor art in that substantially all of the epitaxial layer 102 is removed in the regions external of the mesas 112 and 114. The full depth of this etching is indicated by the dimension 115 shown in FIG. 1C.

The mesas 112 and 114 in the FIG. 113 processing step will ultimately become two separate and electrically isolated photo FET devices. These two devices may therefore be separated following completion of the FIG. 1 fabrication sequence or may be retained in their illustrated relationship and even accompanied by additional such devices where appropriate to the end usage of the photo FET devices. In certain applications, for example, there is a need for a matrix of photo FET devices which are received at predetermined distance intervals across a common substrate member.

Figure 1C:
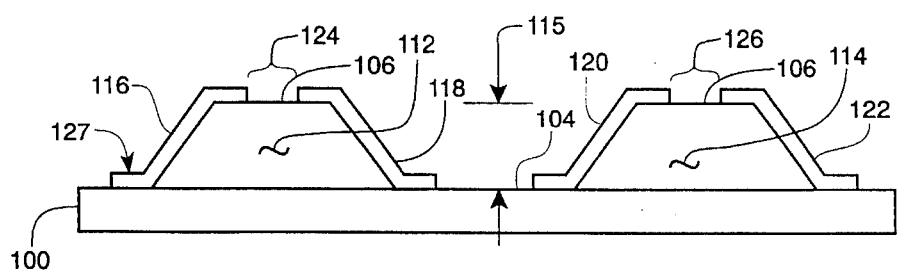
FIG. 1C shows the addition of metal conductor members to the FIG. 1B semiconductor mesas.

FIG. 1C of the drawings shows the addition of ohmic contact metal to the fully-formed mesas 112 and 114 of FIG. 1B. The ohmic contacts added in FIG. 1C are indicated at 116, 118, 120 and 122 for the mesas 112 and 114. By way of these ohmic contact members there are defined FET source and drain regions underlying the ohmic contacts in the epitaxial mesas 112 and 114. The source and drain-related ohmic contacts are separated by the spaces 124 and 126 which are of course, reserved for FET gate structures. For purposes of the present indium inclusive species embodiment of the photo FET invention, it is preferable that the ohmic contact members 116, 118, 120 and 122 be fabricated of the metal alloys nickel germanium gold (NiGeAu) or palladium germanium gold (PdGeAu). As shown at 127 in FIG. 1C, the ohmic contacts extend down to and onto the substrate 100 in order to provide bonding wire or other electrical connection with the completed photo FET devices.

Figure 1D:
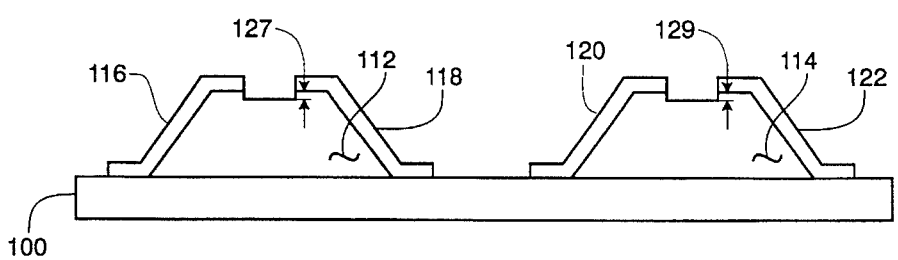
FIG. 1D shows a gate recess etched into the FIG. 1C mesas.

FIG. 1D in the drawings shows the results of etching the epitaxial material of the mesas 112 and 114 to a small recess condition, as is indicated at 127 and 129 in preparation for forming a FET gate structure. The recesses indicated at 127 and 129 may have a depth of 5 nanometers to 50 nanometers with this recess depth being determined in part by electrical characteristics of the resulting photo FET devices. Monitoring of a current flow between the ohmic contacts 116 and 118 for example, may be used in determining the preferred depth for the recesses formed in the spaces 124 and 126 as indicated in FIG. 1D.

Figure 2:
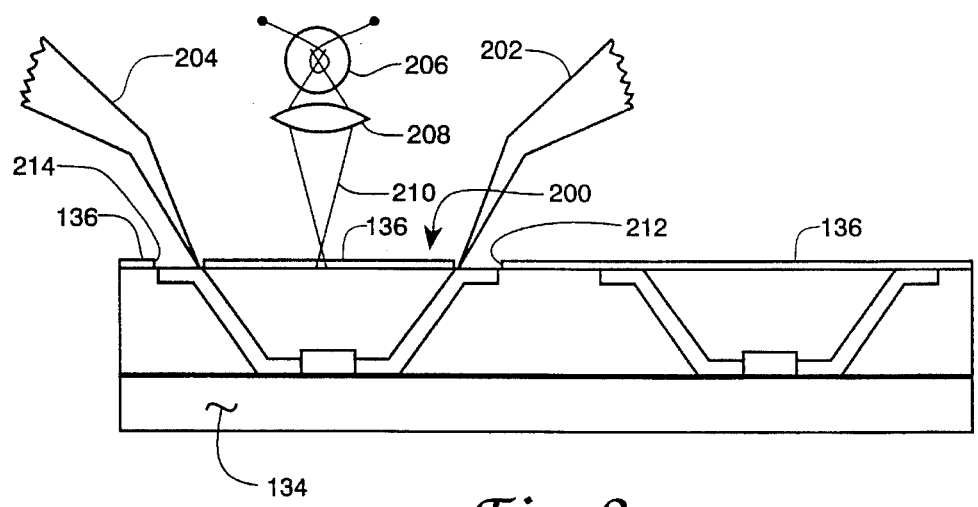
FIG. 2 shows a pair of photo FET devices according to the invention in a probe testing environment.

According to this current monitoring arrangement, contact is made to the partially complete photo FET through electrical microprobes 202, 204 shown in FIG. 2 while the device is held by vacuum to a test chuck. This configuration is accomplished using a Test Probe Station such as provided by Alessi Corporation, Irvine, Calif. The microprobes make electrical contact to the source and drain of the FET, and are electrically biased for example with a semiconductor parameter analyzer such as the Hewlett Packard HP4145, in a manner known to those skilled in the semiconductor test arts. The gate recess forms a hinderance to current flow between source and drain, and monitoring of such gives an indication of the electrical depth of the recess.

Figure 1E:
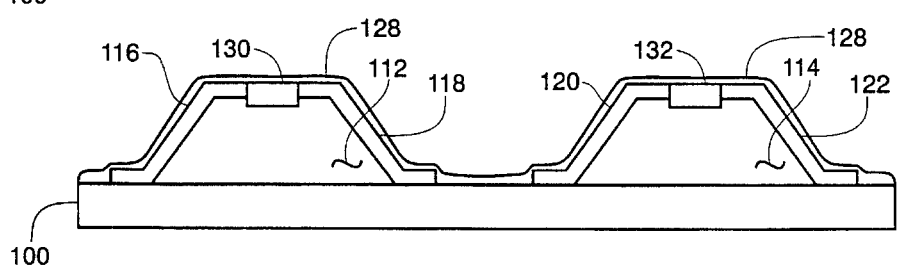
FIG. 1E shows the addition of gate metal and a protective or passivation coating to the devices of FIG. 1D.

FIG. 1E in the drawings shows both the addition of gate metallization in the spaces 124 and 126 and the addition of a passivating coating 128 to the FIG. 1D structure. The gate metallization indicated at 130 and 132 preferably employs a titanium gold (TiAu) alloy and achieves a non-ohmic or electrically insulated or Shottky barrier FET gate arrangement in which charge carrier flow in the mesa region immediately below the gate, is achieved without gate current flow. The TiAu/InAlAs interface achieved below the gate metal 130 and 132 is electrically insulating in nature and thereby enables this charge carrier flow control without current flow. It is of course, intended that the gate metal elements 130 and 132 extend either above or into the page of the FIG. 1E drawing and may in fact extend down a side of the mesas 112 and 114 in the manner of the ohmic contact elements 116, 118, 120 and 122, a side located above or below the page in FIG. 1E. This arrangement, of course, presumes a three-dimensional pyramid or elongated ridge shape for the mesas 112 and 114. The purpose of this metal extension above or below the FIG. 1E page is to provide for bonding metal or other connection to the metallizations 130 and 132.

The protective or passivating layer indicated at 128 in FIG. 1E preferably covers each of the mesas 112 and 114 and their ohmic contact metal members and provides physical and chemical isolation for the covered portions of the FIG. 1E structure. It is desirable that the passivation layer 128 be fabricated of a material such as silicon dioxide ($SiO_2$), however, it is also desirable in view of the present device semiconductor materials that this $SiO_2$ layer be formed at considerably lower temperatures than is practiced in the fabrication of silicon semiconductor devices, for example. A process for achieving this low temperature application of the passivating layer 128 is disclosed in U.S. Pat. No. 4,900,591 for example; the contents of this patent are hereby also incorporated by reference herein. The passivation layer 128 also adds desirable mechanical strength to the FIG. 1E structure; in the interest of drawing clarity this layer is omitted from the showing of FIG. 1F and subsequent figures herein.

An important aspect of the photo FET device fabricated in the FIG. 1 sequence is the attainment of an unencumbered backside region of the epitaxial semiconductor material of the mesas 112 and 114. An unencumbered backside reception of optical energy into the photo FET devices of the FIG. 1 fabrication provides for maximum sensitivity of the device and eliminates the shadowing by metal or other conductors that has occurred in many prior art photo FET devices.

In order to achieve this unencumbered backside optical energy reception, while maintaining the physical spacing between devices, it is desirable to provide a relocated new substrate member for the FIG. 1E devices and to identify the heretofore referred-to substrate 100 as a surrogate substrate which is to be removed in order to provide this desired backside optical energy reception surface. The replacement or new or permanent substrate for the FIG. 1E device is shown at 134 in FIG. 1F and the commencement of removal of the surrogate substrate member 100 is indicated at 135 in FIG. 1F. The new or permanent substrate member 134 is preferably fabricated of an electrically insulating but thermally conductive material such as glass, alumina, a silicon wafer, periodic table Group III, IV or V materials or other substrate materials as are known in the electronic circuit art. It is contemplated that the substrate member 134 may in fact be a wafer of a differing technology semiconductor device such as the wafer of a silicon transistor based integrated circuit assembly.

Figure 1F:
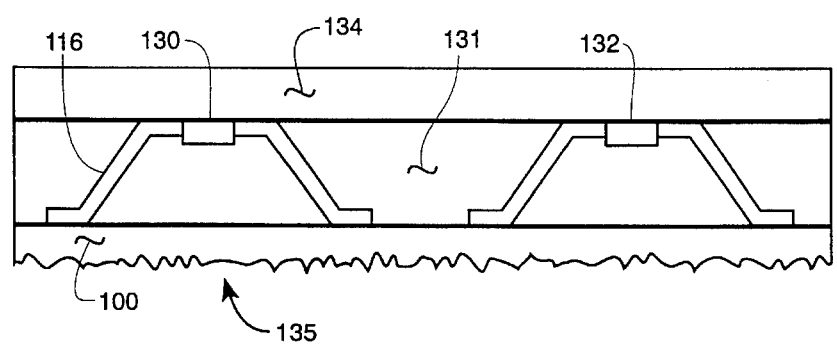
FIG. 1F shows the addition of adhesive filling material and a second substrate to the FIG. 1E structure, along with commenced removal of the original substrate.

The new or permanent substrate 134 is preferably attached to the passivation coating 128 of the FIG. 1E structure using a material such as a filled and thermally conductive epoxy adhesive as is represented at 131 in the FIG. 1F drawing. This filled and thermally conductive epoxy adhesive serves both to fill the void regions intermediate adjacent mesas of the FIG. 1 structure and also as an adhesive attachment medium for retaining the substrate 134 integral with the mesas 112 and 114. An epoxy adhesive such as the type H74 adhesive sold by Epoxy Technology Inc. of Billerica, Mass. has been found suitable for use at 131 in the FIG. 1 structure.

Removal of the substrate 100 from the FIG. 1F structure as is indicated at 135 in FIG. 1F, may be accomplished by a combination of polishing (or grinding) and chemical etching wherein the substrate is thinned to a remaining thickness of about 5 micrometers by mechanical abrasion polishing and then etched away with a hydrochloric acid (HCl) etch as is known in the semiconductor art.

Figure 1G:
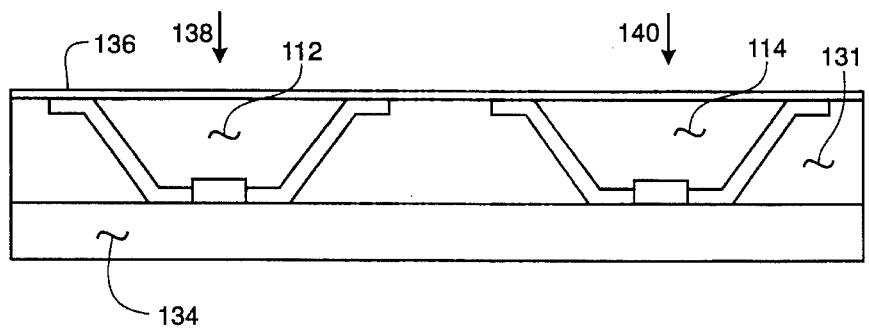
FIG. 1G shows a physical inversion of the FIG. 1F structure, together with the addition of a backside passivation coating.

FIG. 1G in the drawings shows the photo FET devices of the FIG. 1 fabrication sequence in an optical energy reception surface-up view that is inverted from the FIG. 1F drawing. The unobstructed optical energy access to the semiconductor material of the mesas 112 and 114, the access represented at 138 and 140 in FIG. 1G is of course, a significant aspect of the FIG. 1 processing sequence. FIG. 1G also shows the addition of a second protection or passivating layer 136 to the now-exposed backside portion of the FIGS. 1A–1F mesas 112 and 114. Preferably this passivating layer 136 is also fabricated of silicon dioxide and is fabricated according to the low temperature process of the above incorporated-by-reference U.S. Pat. No. 4,900,591. In addition to the low temperature processing of this silicon dioxide layer being desirable for preservation of the semiconductor materials in the FIG. 1G drawing, it is also desirable that the epoxy material at 131 remain at low temperature during application of the layer 136 coating. Prior to application of this layer 136 coating the photo FET devices of FIG. 1G were of course available for electrical testing and grading if so desired.

In addition to the layer 136 providing passivation protection for the FIG. 1 photo FET devices, it is found that the anti-reflection properties inherently achieved with such a layer provide for an increased reception of optical energy into the semiconductor material of the exposed backside face. When the somewhat textured surface of the preferred silicon dioxide coating is employed its intermediate value of refraction index provides less reflection and an increase of up to 30% in electrical signal output. This passivation coating is also found to add desirable mechanical strength to the FIG. 1 structure.

Table I summarizes the processing steps described in FIG. 1 and generally corresponds with the steps shown in the FIG. 1 drawing. The abbreviations appearing in the Table I sequence are defined in the preceding paragraphs.

TABLE I

| Processing Sequence |
|---|
| InP Lattice Matched InGaAs/InAlAs on InP |
| 3" InP MBE Materials from QED |
| 2" InP MOCVD Materials from EPI |
| $H_3PO_4$ Mesa Etch |
| Ohmic Contacts |
| NiGeAu |
| PdGeAu |
| Gate Recess, Gate Metallization (TiAu) |
| Front side Passivation - Low Temperature $SiO_2$ |
| Adhesive Bonding |
| Substrate Removal - Polish + HCl etch |
| Backside Passivation - Low Temperature $SiO_2$ |

FIG. 2 in the drawings shows the photo FET devices of the FIG. 1 fabrication sequence in a substantially completed but as yet unpackaged condition. FIG. 2 also shows the placement of electrical probing contacts 202 and 204 on exposed metal portions of the ohmic contact members 116, 118, 120 and 122 from FIG. 1C. In order to enable this probing contact, the protective coating layer 136 has been removed or provided with accessing apertures as are indicated at 212 and 214 in FIG. 2. These contact apertures may be achieved through the use of conventional mask and etch procedures as are known in the semiconductor device art.

As is also illustrated in FIG. 2, only one of the fabricated photo FET devices is being tested in the illustrated arrangement. This testing includes, in addition to the probe contacts 202 and 204, the provision of an optical energy input signal as may be provided, for example, by the incandescent filament lamp 206 and an optical system such as is represented by the lens element 208. By way of the lamp 206 and the lens 208, a focused and controllable beam of optical energy 210 which includes spectral components falling in the contemplated 1.3–1.6 micrometer wavelength response of the FIG. 1 photo FET devices is accomplished. Other optical energy source arrangements can of course be employed. The probing illustrated in FIG. 2 may involve an automated "step and repeat" operation on a completed wafer or alternately, may be arranged as a probing of multiple devices in a parallel access arrangement, all as are known and practiced in the semiconductor art.

The present invention therefore provides a photodetector apparatus having an unencumbered light reception surface and achieves this in the form of a FET that is fully compatible with the processing of FET amplifying and switching devices. By way of this compatibility with conventional FET devices, it is therefore possible to achieve a photodetector on the same wafer and with the same processing steps as are used in fabricating the remaining areas of the wafer. This compatibility is therefore believed to be a significant advantage over other photodetector arrangements.

The device of the present invention can also be fabricated in discrete component form and added to wafers or other substrates as needed. The present invention is also amenable to the High Electron Mobility Transistor (HEMT) channel thickness and current density variation and grading of the hole blocking in InGaAs/InAlAs heterojunctions.

Photo FET devices according to the present invention therefore represent an inherently integratable photodetector for optical control of other electronic circuits including microwave and digital processing circuits. Devices according to the invention therefore find potential application in the fields of optical communication, optical computing, optical control, and other state-of-the-art electronic applications.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The method of fabricating an indium inclusive photo field effect transistor of high optical energy sensitivity comprising the steps of:

growing, on an indium phosphide surrogate temporary first substrate member, an indium phosphide lattice-matched epitaxial layer having a composition taken from the materials group consisting of indium gallium arsenide and indium aluminum arsenide;

etching said epitaxial layer until a plurality of upstanding mesas thereof remain, said etching including removal of said epitaxial layer material from a top surface down to said substrate member at locations intermediate of said mesas;

depositing ohmic metal source and drain contacts on laterally segregated exposed top surface portions of said epitaxial layer mesas;

etching a gate recess into said epitaxial layer top surface at a location intermediate said ohmic metal contacts in each of said mesas;

forming a metallic electrically insulated Shottky gate member in said top surface gate recess of each said mesa;

covering said top surface, said Shottky gate member and said adjacent source and drain ohmic contact metal with an inert material passivation layer;

filling said locations intermediate of said mesas with an inert filling material to form a co-planar surface with said passivated top surface, Shottky gate member and adjacent source and drain ohmic contact metal;

bonding said planar surface to a second permanent substrate member to form a covered topside assembly;

removing said indium phosphide surrogate first substrate member from said covered topside assembly to expose an optical energy receptive and unencumbered backside epitaxial layer surface of said mesas and optical energy receptive and unencumbered backside portions of said Shottky gate member metal, and said source and drain ohmic contact metal;

making external circuit communication connections with said Shottky gate metal, and said source and drain ohmic contact metal; and overlaying said exposed backside epitaxial layer surface with an inert second material passivation layer.

2. The method of claim 1 wherein said growing step includes one of the steps of molecular beam epitaxial deposition and metal organic chemical vapor deposition.

3. The method of claim 1 wherein said etching said epitaxial layer step includes a phosphoric acid etching step.

4. The method of claim 1 wherein said depositing ohmic metal step includes deposition of one of the metal alloys taken from the group consisting of nickel germanium gold and palladium germanium gold.

5. The method of claim 1 wherein said etching of a gate recess includes etching a recess to a depth between zero and fifty nanometers.

6. The method of claim 1 wherein said forming step includes deposition of a titanium gold alloy metal.

7. The method of claim 1 wherein said covering and overlaying steps each include low temperature forming of a silicon dioxide passivation layer.

8. The method of claim 1 wherein said filling and bonding steps each include application of a thermal conductivity enhanced epoxy adhesive material.

9. The method of claim 1 wherein said second permanent substrate member comprises one of:

an integrated circuit wafer of one of Group III, Group IV, and Group V material composition;

a thermally conducting electrically insulating member, and a glass member.

10. The method of claim 1 wherein said making and overlaying steps are performed in reverse order and said overlaying step includes excluding portions of said metal from overlaying by said passivation layer.

11. The method of claim 1 wherein said removing step includes both physical and chemical displacement steps.

* * * * *